United States Patent
Donadille et al.

(10) Patent No.: US 10,622,806 B2
(45) Date of Patent: Apr. 14, 2020

(54) SYSTEM AND METHOD FOR MANAGING SHORT-CIRCUITS IN A MESHED ELECTRICAL ENERGY DISTRIBUTION NETWORK OF AN AIRCRAFT

(71) Applicant: Airbus Operations SAS, Toulouse (FR)

(72) Inventors: Christian Donadille, Castanet-Tolosan (FR); Franck Chabot, Blagnac (FR); Florian Fahy, Ramonville (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 328 days.

(21) Appl. No.: 15/793,069

(22) Filed: Oct. 25, 2017

(65) Prior Publication Data
US 2018/0123337 A1 May 3, 2018

(30) Foreign Application Priority Data
Oct. 28, 2016 (FR) ..................... 16 60478

(51) Int. Cl.
*H02H 7/28* (2006.01)
*H02H 9/02* (2006.01)
(Continued)

(52) U.S. Cl.
CPC ............. *H02H 7/28* (2013.01); *G01R 31/086* (2013.01); *H02H 3/025* (2013.01); *H02H 3/027* (2013.01);
(Continued)

(58) Field of Classification Search
CPC .......... H02H 3/025; H02H 3/027; H02H 3/40; H02H 7/222; H02H 7/28; H02H 7/26; H02H 7/30; H02H 9/025; G01R 31/086
(Continued)

(56) References Cited

U.S. PATENT DOCUMENTS

2014/0354039 A1 12/2014 Donadille
2015/0134137 A1 5/2015 Perju et al.

FOREIGN PATENT DOCUMENTS

| DE | 102005005236 | 8/2006 |
| FR | 3013163 | 5/2015 |
| GB | 2479535 | 10/2011 |

OTHER PUBLICATIONS

Machine translation of Leohold German Patent Document DE 102005005236 A1, Aug. 10, 2006 (Year: 2006).*
French Search Report, dated Jun. 30, 2017, priority document.

* cited by examiner

*Primary Examiner* — Kevin J Comber
(74) *Attorney, Agent, or Firm* — Greer, Burns & Crain, Ltd.

(57) ABSTRACT

A system for managing short-circuits in an aircraft meshed electrical energy distribution network, comprising nodes connected to one another by inter-node links forming a mesh of the network. A system node comprises a switch, a current limiter, circuitry elements to measure the current intensity circulating on the link and circuitry elements to measure a voltage drop on the link, and a control unit configured to acquire a link current measurement, compare the measurement with a predetermined current threshold and, if the measurement exceeds this threshold, command the current limiter to limit the link current, acquire a link voltage drop measurement, determine a time associated with the value of the voltage drop and check whether the voltage drop is still present after a time period equal to the time obtained, and if the voltage drop is still present then, command the opening of the switch corresponding to this link.

10 Claims, 4 Drawing Sheets

(51) Int. Cl.
    *H02H 7/30*     (2006.01)
    *H02H 7/26*     (2006.01)
    *H02H 3/027*     (2006.01)
    *H02H 3/02*     (2006.01)
    *G01R 31/08*     (2020.01)
    *H02H 3/40*     (2006.01)
    *H02H 7/22*     (2006.01)

(52) U.S. Cl.
    CPC .............. *H02H 3/40* (2013.01); *H02H 7/222* (2013.01); *H02H 7/26* (2013.01); *H02H 7/30* (2013.01); *H02H 9/025* (2013.01)

(58) Field of Classification Search
    USPC .......................................................... 361/52
    See application file for complete search history.

SYSTEM AND METHOD FOR MANAGING SHORT-CIRCUITS IN A MESHED ELECTRICAL ENERGY DISTRIBUTION NETWORK OF AN AIRCRAFT

CROSS-REFERENCES TO RELATED APPLICATIONS

This application claims the benefit of the French patent application No. 1660478 filed on Oct. 28, 2016, the entire disclosures of which are incorporated herein by way of reference.

TECHNICAL FIELD

The present invention relates to a method and a system for managing short-circuits in a meshed electrical energy distribution network of an aircraft, and a node of such a meshed network.

BACKGROUND OF THE INVENTION

New electrical energy distribution supply networks are emerging in aircraft. These networks have a meshed structure. A meshed electrical energy distribution network comprises nodes to which at least one power source and equipment items to be powered by said power source can be connected by means of links, called external links. The nodes are connected to one another by inter-node links forming at least one mesh of a meshed network. Each mesh is polygonal of an order greater than or equal to three. An example of meshed network is described in the application FR 3013163 filed in the name of the applicant.

The electrical energy delivered by the at least one power source is distributed to the equipment items to be powered via the inter-node links by different paths.

When a short-circuit or an overload occurs on an inter-node link, the link on which the short-circuit or overload occurs must be isolated from the rest of the meshed network in order to guarantee the continuity in the supply of the electrical energy to the equipment items to be powered.

A short-circuit can be straight or impeding.

A short-circuit is straight when two short-circuited points touch directly. A short-circuit is impeding when the two short-circuited points are linked by an impeding medium.

Upon the occurrence of a short-circuit, it is desirable to maintain, to a certain extent, the plurality of paths by which the electrical energy is distributed.

SUMMARY OF THE INVENTION

An aim of the present invention is to guarantee that, upon the occurrence of a short-circuit, only the inter-node link on which the short-circuit occurs is isolated from the rest of the meshed network.

To this end, according to a first aspect, the invention proposes a system for managing short-circuits in a meshed electrical energy distribution network of an aircraft, the electrical energy distribution network comprising nodes to which at least one power source, and equipment items to be powered, can be connected by means of links, called external links, the nodes being connected to one another by inter-node links forming at least one mesh of the meshed network, each mesh being polygonal of an order greater than or equal to three, characterized in that at least one node of the system comprises:

for at least one inter-node link linking the node to another node:
a switch,
a current limiter,
means for measuring the intensity of a current circulating on said inter-node link,
means for measuring a voltage drop on said inter-node link,
a control unit configured to:
acquire a current measurement on said at least one inter-node link, by the intensity measurement means,
compare the current measurement with a predetermined current threshold and, if the current measurement exceeds this predetermined threshold:
command the current limiter to limit the current on the inter-node link,
acquire a measurement of a voltage drop on the inter-node link by the voltage measurement means,
determine a time associated with the value of the voltage drop out of a plurality of times associated with different voltage drop values, each time being different from the other times and being less than each time associated with a voltage drop value less than the voltage drop value with which it is associated,
check whether the voltage drop is still present after a time period equal to the time obtained,
if the voltage drop is still present after the time period equal to the time obtained, command the opening of the switch corresponding to this inter-node link so as not to allow the passage of an electrical current in this inter-node link on which the voltage drop has occurred.

The invention relates also to a node of a meshed electrical energy distribution network of an aircraft, the electrical energy distribution network comprising nodes to which at least one power source and equipment items to be powered can be connected by means of links, called external links, the nodes being connected to one another by inter-node links forming at least one mesh of the meshed network, each mesh being polygonal of an order greater than or equal to three, said node being characterized in that it comprises:

for at least one inter-node link linking the node to another node:
a switch,
a current limiter,
means for measuring the intensity of a current circulating on said inter-node link,
means for measuring a voltage drop on said inter-node link,
a control unit configured to:
acquire a current measurement on said at least one inter-node link, by the intensity measurement means,
compare the current measurement with a predetermined current threshold and, if the current measurement exceeds this predetermined threshold:
command the current limiter to limit the current on the inter-node link,
acquire a measurement of a voltage drop on the inter-node link by the voltage measurement means,
determine a time associated with the value of the voltage drop out of a plurality of times associated with different voltage drop values, each time being different from the other times and being less than each time associated with a voltage drop value less than the voltage drop value with which it is associated,
check whether the voltage drop is still present after a time period equal to the time obtained, if the voltage drop is still present after the time period equal to the time obtained, command the opening of the switch corresponding to this inter-node link so as not to allow the passage of an electrical current in this inter-node link on which the voltage drop has occurred.

The invention relates also to a method for managing short-circuits in a meshed electrical energy distribution network of an aircraft, the electrical energy distribution network comprising nodes to which at least one power source and equipment items to be powered can be connected by means of links, called external links, the nodes being connected to one another by inter-node links forming at least one mesh of the meshed network, each mesh being polygonal of an order greater than or equal to three, characterized in that, at least one node comprising:

for at least one inter-node link linking the node to another node:
a switch,
a current limiter,
means for measuring the intensity of a current circulating on said inter-node link,
means for measuring a voltage drop on said inter-node link,
a control unit,
the method comprises the following steps executed by the control unit:
acquiring a current measurement on said at least one inter-node link, by the intensity measurement means,
comparing the current measurement with a predetermined current threshold and, if the current measurement exceeds this predetermined threshold:
commanding the current limiter to limit the current on the inter-node link,
acquiring a measurement of a voltage drop on the inter-node link by the voltage measurement means,
determining a time associated with the value of the voltage drop out of a plurality of times associated with different voltage drop values, each time being different from the other times and being less than each time associated with a voltage drop value less than the voltage drop value with which it is associated,
checking whether the voltage drop is still present after a time period equal to the time obtained,
if the voltage drop is still present after the time period equal to the time obtained, commanding the opening of the switch corresponding to this inter-node link so as not to allow the passage of an electrical current in this inter-node link on which the voltage drop has occurred.

Thus, by limiting an overcurrent and by measuring a voltage drop resulting from the limiting of the overcurrent, on one of the inter-node links linking it to another node, each node of the meshed electrical energy distribution network of the aircraft is capable of determining whether a short-circuit is present on an electrical energy supply path which takes one of the inter-node links linking it to another node.

The inventors have noted that the closer a node placed on an electrical energy supply path on which a short-circuit occurs is to the inter-node link on which the short-circuit occurs, the greater the voltage drop value.

By obtaining a time which is a function of the voltage drop, and by using the latter as a time delay to trigger the opening of a switch, the or each node closest to the inter-node link on which the short-circuit occurs commands the opening of a switch to interrupt the circulation of a current in the inter-node link on which the short-circuit occurs.

The nodes more distant from the inter-node link on which the short-circuit occurs obtain a greater time because the corresponding voltage drop is lower than that corresponding to the inter-node link on which the short-circuit occurs. On checking whether the voltage drop is still present after a time period equal to the time obtained, the more distant nodes determine that the voltage drop is no longer present because the closest nodes have already commanded the opening of the switch.

Thus, on the occurrence of a short-circuit, only the inter-node link on which the short-circuit occurs is isolated from the rest of the meshed network.

Advantageously, the control unit is configured to keep the switch closed so as to allow the passage of an electrical current in the inter-node link on which the voltage drop has occurred, if the voltage drop is no longer present after the time period equal to the time obtained.

According to a particular embodiment of the invention, each node of the meshed electrical energy distribution network of the aircraft is identical to the other nodes of the meshed electrical energy distribution network of the aircraft.

According to a particular embodiment of the invention, the node comprises a switch for each inter-node link linking it to another node, a current limiter for each inter-node link linking it to another node, means for measuring the intensity of a current circulating on each inter-node link and means for measuring a voltage drop on each inter-node link.

According to a particular embodiment of the invention, the current limiter is an electronic device advantageously comprising at least one transistor. In particular, this electronic device also provides the switch function for the inter-node link concerned.

In particular, the voltage measurement means are conformed to measure the voltage at the terminals of the current limiter.

The present invention also relates to an aircraft which comprises a system for managing short-circuits in a meshed electrical energy distribution network according to the present invention.

BRIEF DESCRIPTION OF THE DRAWINGS

The features of the invention mentioned above, and others, will become more clearly apparent on reading the following description of an exemplary embodiment, said description being given in relation to the attached drawings, in which.

DETAILED DESCRIPTION OF THE PREFERRED EMBODIMENTS

Figure 1:
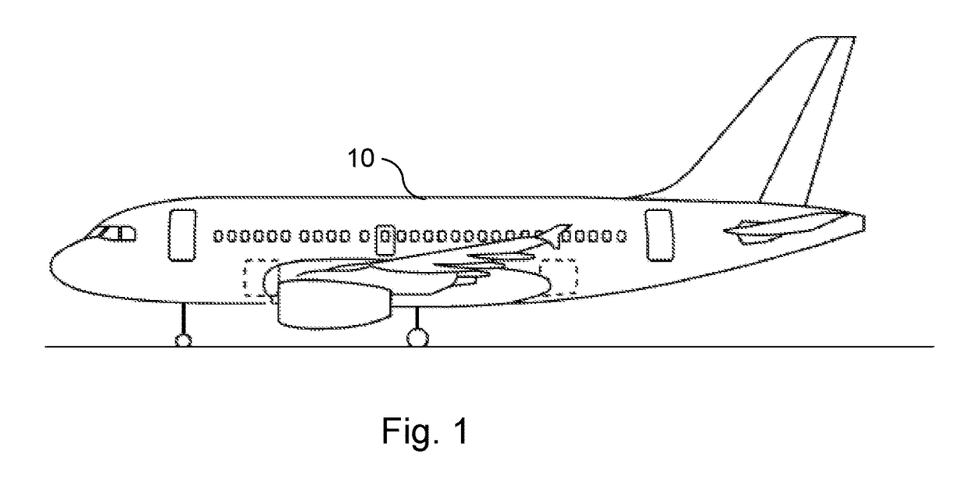
FIG. 1 represents an aircraft comprising a system for managing short-circuits in a meshed electrical energy distribution network of the aircraft according to an embodiment of the invention.

FIG. 1 represents an aircraft 10 comprising a system for managing short-circuits in a meshed electrical energy distribution network of the aircraft according to an embodiment of the invention.

The aircraft comprises a system 1 for managing short-circuits in a meshed electrical energy distribution network.

Figure 2:
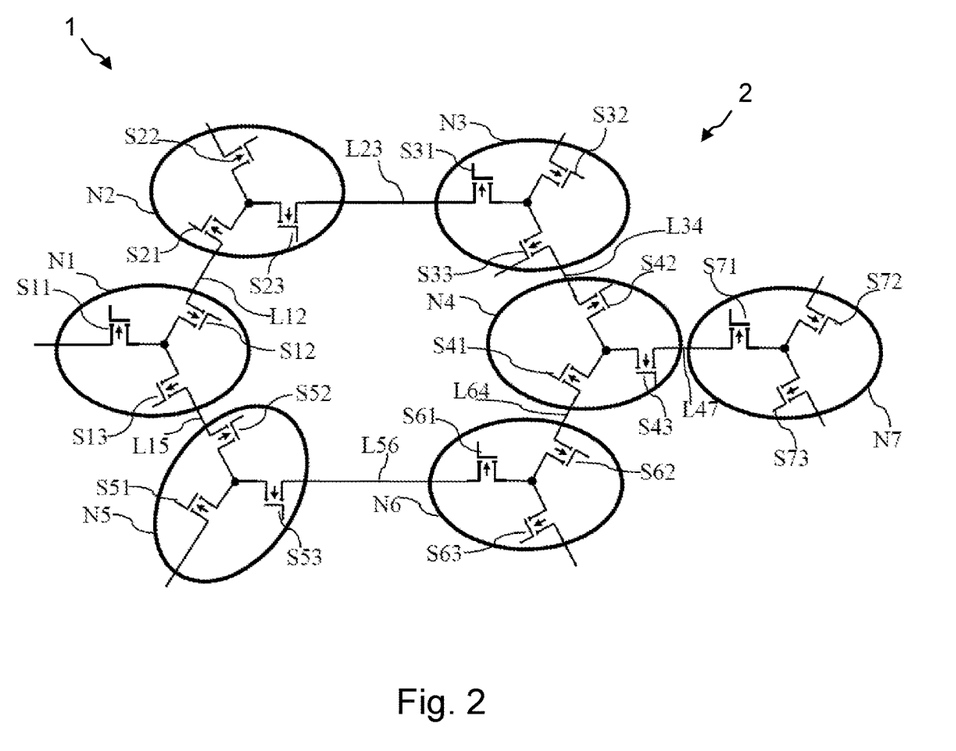
FIG. 2 represents a part of a meshed electrical energy distribution network of an aircraft according to an embodiment of the invention.

A part of a meshed electrical energy distribution network of the aircraft is represented in FIG. 2.

FIG. 2 represents a part of a meshed electrical energy distribution network 2 of an aircraft according to an embodiment of the invention.

In the example of FIG. 2, seven nodes N1 to N7 are represented.

Each node Ni, with i=1 to 7, comprises a switch for each inter-node link linking it to another node.

The nodes are linked to one another by inter-node links denoted L12, L23, L34, L15, L56, L64 and L47.

The node N1 comprises a switch S12 allowing or preventing the passage of an electrical current in the inter-node link L12, a switch S13 allowing or preventing the passage of an electrical current in the inter-node link L15 and a switch S11 allowing or preventing the passage of an electrical current in an inter-node link not represented in FIG. 2.

The node N2 comprises a switch S21 allowing or preventing the passage of an electrical current in the inter-node link L12, a switch S23 allowing or preventing the passage of an electrical current in the inter-node link L23 and a switch S22 allowing or preventing the passage of an electrical current in an inter-node link not represented in FIG. 2.

The node N3 comprises a switch S31 allowing or preventing the passage of an electrical current in the inter-node link L23, a switch S33 allowing or preventing the passage of an electrical current in the inter-node link L34 and a switch S32 allowing or preventing the passage of an electrical current in an inter-node link not represented in FIG. 2.

The node N4 comprises a switch S41 allowing or preventing the passage of an electrical current in an inter-node link L64, a switch S42 allowing or preventing the passage of an electrical current in the inter-node link L34 and a switch S43 allowing or preventing the passage of an electrical current in an inter-node link L47.

The node N5 comprises a switch S52 allowing or preventing the passage of an electrical current in the inter-node link L15, a switch S53 allowing or preventing the passage of an electrical current in an inter-node link L56 and a switch S51 allowing or preventing the passage of an electrical current in an inter-node link not represented in FIG. 2.

The node N6 comprises a switch S61 allowing or preventing the passage of an electrical current in the inter-node link L56, a switch S62 allowing or preventing the passage of an electrical current in the inter-node link L64 and a switch S63 allowing or preventing the passage of an electrical current in an inter-node link not represented in FIG. 2.

The node N7 comprises a switch S71 allowing or preventing the passage of an electrical current in the inter-node link L47, a switch S72 allowing or preventing the passage of an electrical current in an inter-node link not represented in FIG. 2 and a switch S73 allowing or preventing the passage of an electrical current in an inter-node link not represented in FIG. 2.

Figure 3:
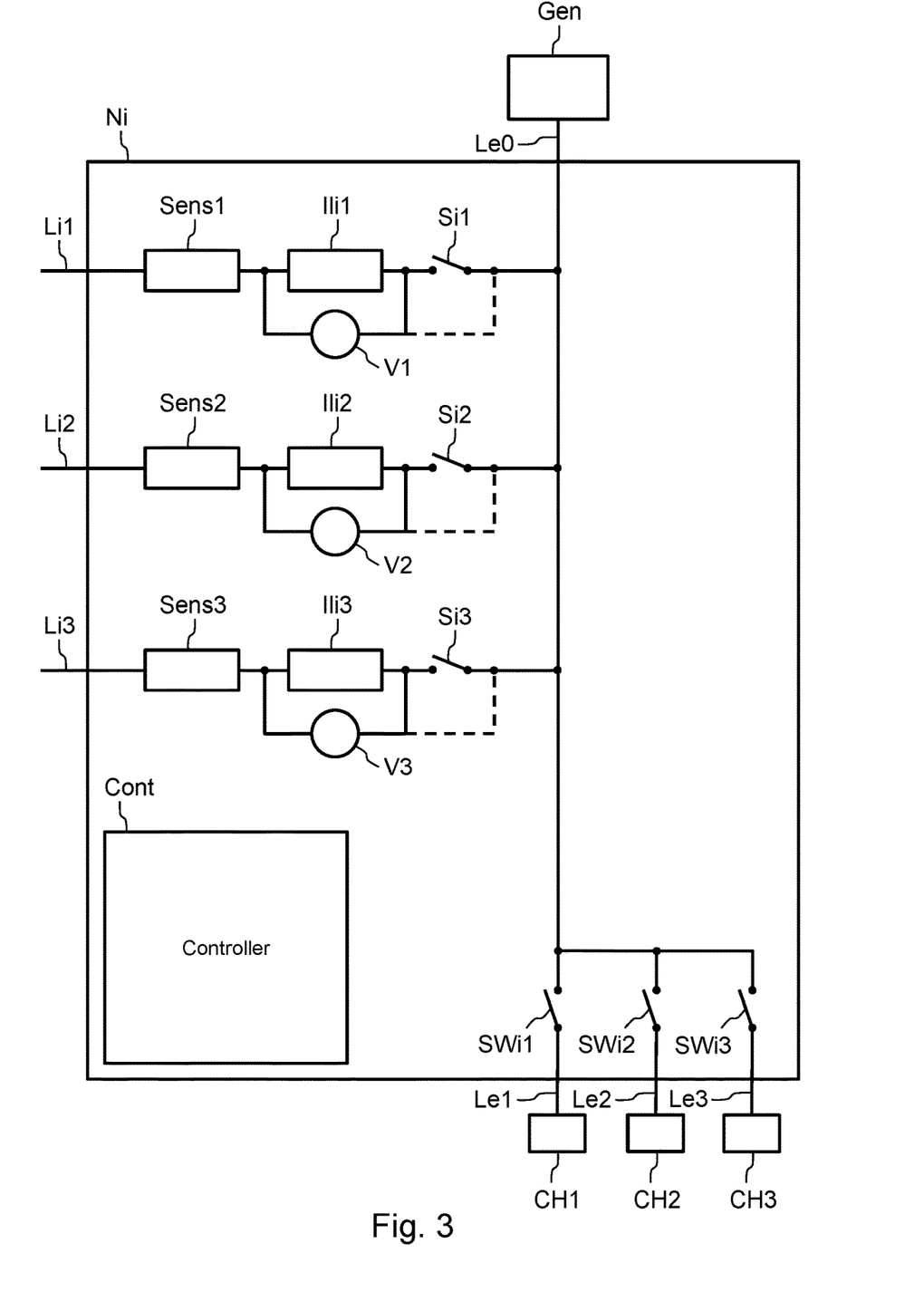
FIG. 3 represents an example of architecture of a node of a meshed electrical energy distribution network of an aircraft according to an embodiment of the invention.

FIG. 3 represents an example of architecture of a node of a meshed electrical energy distribution network of an aircraft according to an embodiment of the invention.

The nodes Ni, with i=1 to 7, are identical.

The node Ni represented in FIG. 3 is provided to be connected to three other nodes, by means of three inter-node links Li1, Li2, Li3. As has been described previously, the node Ni comprises three switches Si1 to Si3 allowing or preventing the passage of an electrical current respectively in the abovementioned three inter-node links.

The node Ni comprises a current limiter $I1i1$ to $I1i3$ for each link with which one of the switches Si1 to Si3 is associated. It also comprises means Sens1 to Sens3 for measuring the intensity of a current circulating on each of the three inter-node links. These measurement means correspond to standard means for measuring the intensity of a current, for example comprising shunts mounted in series respectively with each of the switches Si1 to Si3.

The node Ni also comprises means V1 to V3 for measuring a voltage drop on each of the inter-node links. These measurement means correspond to standard voltage measurement means, for example of voltmeter type. In the particular embodiment represented in FIG. 3, the measurement means V1 to V3 are linked to the terminals respectively of the current limiters $I1i1$ to $I1i3$.

In a particular embodiment, the current limiters $I1i1$ to $I1i3$ each correspond to an electronic device. Advantageously, this electronic device comprises at least one transistor. This transistor is, for example, a field effect transistor FET, an MOS (Metal Oxide Semiconductor) type transistor, an IGBT (Insulated Gate Bipolar Transistor) transistor, a bipolar transistor, etc. Even more advantageously, the electronic device also makes it possible to provide a switch function, such that the electronic devices corresponding to the different inter-node links each include the functions of current limiter and of switch, respectively ($I1i1$, Si1), ($I1i2$, Si2) and ($I1i3$, Si3). The means V1 to V3 for measuring a voltage drop are then linked respectively to the terminals of the different electronic devices, as represented by broken line in FIG. 3.

In an advantageous embodiment, the switches Si1 to Si3 are bidirectional, that is to say that the current can circulate equally well in one direction as in the other on the inter-node link. That is made possible, for example, by the use of FET transistors in the electronic device. In the case of the use of bipolar transistors, the electronic device advantageously comprises two transistors mounted in opposite directions so as to allow the circulation of a current equally well in one direction as in the other on the inter-node link.

The node Ni can be connected by means of an external link Le0 to a power source Gen.

The node Ni can be connected by means of external links Le1, Le2, Le3 respectively to equipment items CH1 to CH3 to be powered with electrical energy.

The connection to the equipment items CH1 to CH3 can be carried out respectively via switches denoted SWi1 to SWi3.

The node Ni also comprises a controller, or control unit, Cont, which will be described in more detail in light of FIG. 4. The means Sens1 to Sens3 for measuring the intensity of a current, and the means V1 to V3 for measuring a voltage drop, are linked to the controller Cont so as to allow the acquisition respectively of measurements of current intensity or of voltage by the controller Cont.

The current limiters $I1i1$ to $I1i3$ are controlled by the controller Cont. The opening and the closing of the switches Si1 to Si3, and possibly of the switches SWi1 to SWi3, are also controlled by the controller Cont.

Figure 4:
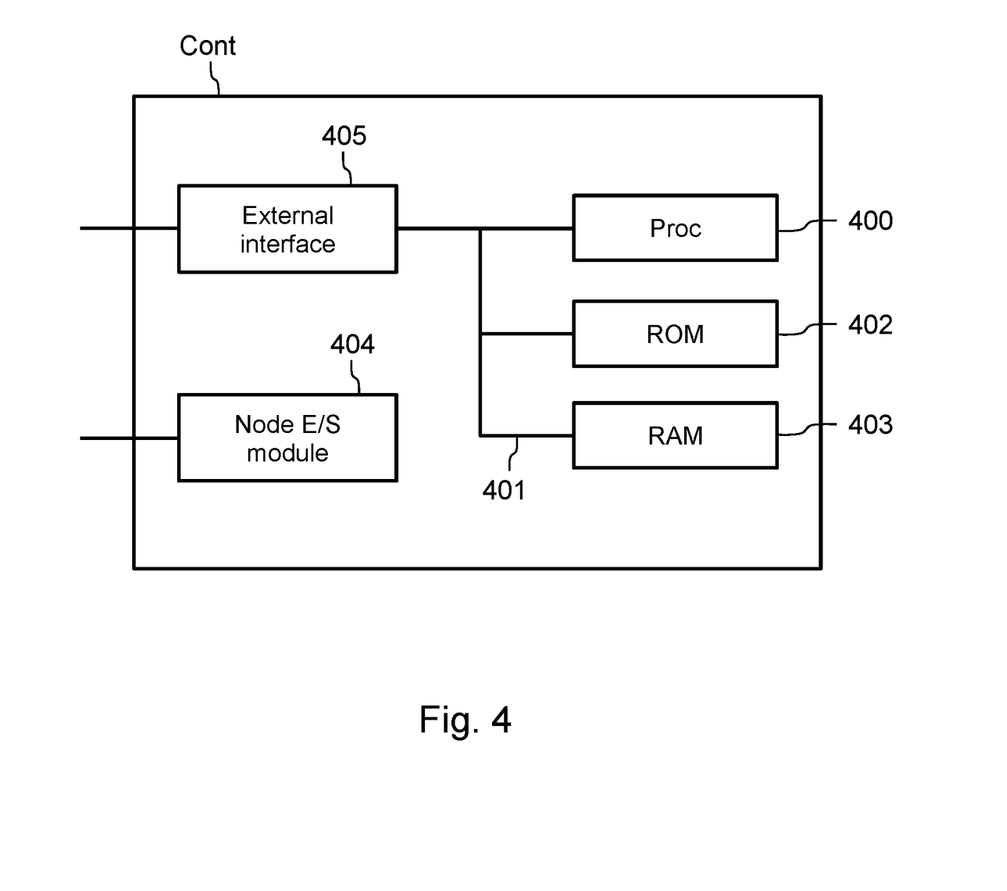
FIG. 4 represents an example of architecture of a controller of a node of a meshed electrical energy distribution network of an aircraft according to an embodiment of the invention.

FIG. 4 represents an example of architecture of a controller, or control unit, of a node of a meshed electrical energy distribution network of an aircraft according to an embodiment of the invention.

The controller Cont comprises:
- a processor, microprocessor or microcontroller 400;
- a volatile memory 403;
- a non-volatile memory 402;
- an input/output module 404;
- an interface for external communication 405;
- a communication bus 401 linking the processor 400 to the ROM memory 402, to the RAM memory 403, to the input/output module 404 and to the interface for external communication 405.

The input/output module 404 is linked at the input to the means Sens1 to Sens3 for measuring the intensity of a current, and to the means V1 to V3 for measuring a voltage drop. It is also linked at the output to the current limiters I1$i$1 to I1$i$3, to the switches Si1 to Si3 and to the switches SWi1 to SWi3.

The processor 400 is capable of executing instructions loaded into the volatile memory 403 from the non-volatile memory 402, from an external memory (not represented), from a storage medium, such as an SD card or similar, or from a communication network. When the controller Cont is powered up, the processor 400 is capable of reading instructions from the volatile memory 403 and of executing them. These instructions form a computer program which causes the implementation, by the processor 400, of all or part of the method described in relation to FIG. 5.

Figure 5:
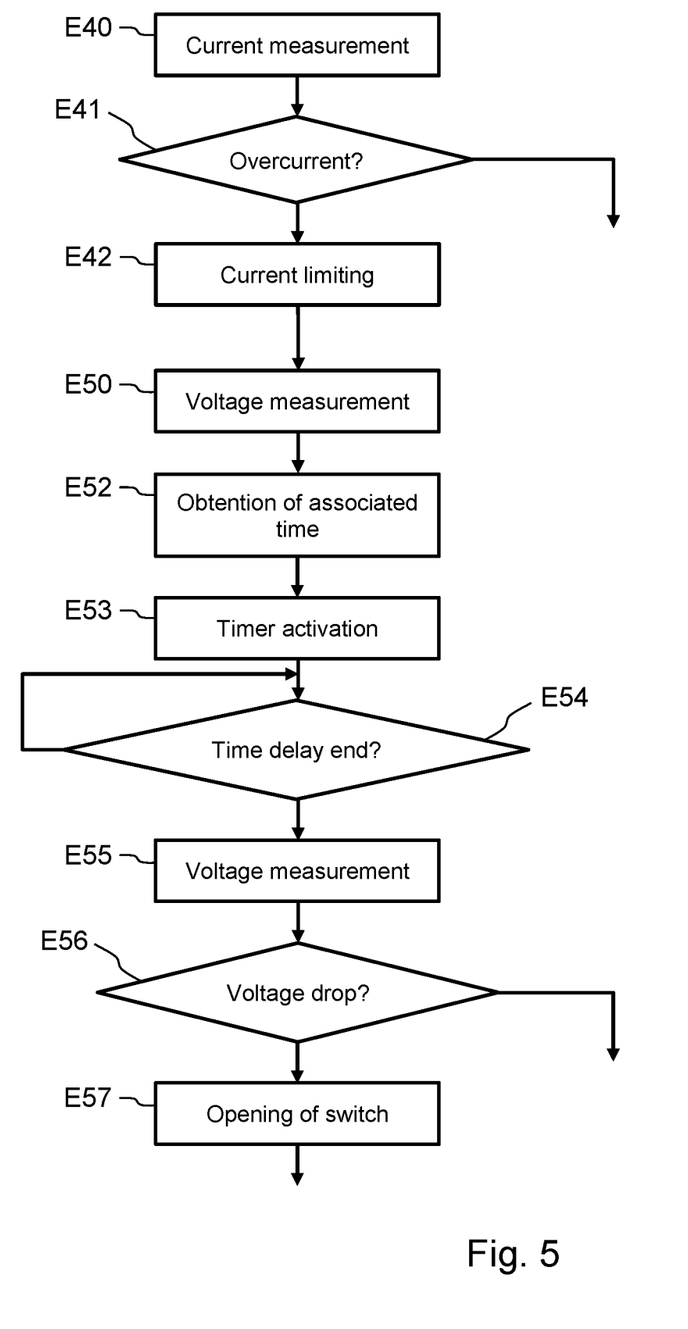
FIG. 5 represents an example of algorithm executed by each node of the meshed electrical energy distribution network of an aircraft according to an embodiment of the invention.

All or part of the method described in relation to FIG. 5 can be implemented in software form by the execution of a set of instructions by a programmable machine, such as a DSP (Digital Signal Processor) or a microcontroller, or be implemented in hardware form by a machine or a dedicated component, such as an FPGA (Field-Programmable Gate Array) or an ASIC (Application-Specific Integrated Circuit).

The non-volatile memory 402 further comprises a table associating a plurality of times with different voltage drop values, each time being different from the other times and being less than each time associated with a voltage drop value less than the voltage drop value with which it is associated.

For example, and in a nonlimiting manner, the table comprises three or four ranges of voltage drop values, a time being associated with each range of values.

In operation, when a voltage drop value is obtained, the time associated with the range of values including the voltage drop value obtained is associated with the voltage drop value obtained.

These ranges of values are for example defined on the basis of the characteristics intrinsic to the meshed electrical energy distribution network and/or of the nodes.

The times are determined in the same way on the basis of the characteristics intrinsic to the meshed electrical energy distribution network and/or of the nodes so as to avoid any inappropriate opening linked to spurious phenomena and to guarantee that the time conforms to the characteristics of the electronic components of the nodes.

In a particular exemplary embodiment, nonlimiting on the invention, the ranges of values and the associated time delays are defined as explained hereinbelow, for a meshed electrical energy distribution network of an aircraft, in which the nominal voltage delivered by the power sources is 270 Vdc. In the example considered, the different current limiters are controlled by the controllers of the different nodes so as to limit the current on the different inter-node links to 15 A. For a first range of voltage drop values corresponding to a voltage drop greater than or equal to 10 Vdc and less than 130 Vdc, the associated to time delay is 10 ms. For a second range of voltage drop values corresponding to a voltage drop greater than or equal to 130 Vdc and less than 260 Vdc, the associated time delay is 500 µs. For a third range of voltage drop values corresponding to a voltage drop greater than or equal to 260 Vdc, the associated time delay is 50 µs.

The interface for external communication 405 makes it possible to communicate with other nodes, with a central device for managing the meshed electrical energy distribution network of the aircraft 10 or with other systems of the aircraft.

FIG. 5 represents an example of algorithm executed by each node of the meshed electrical energy distribution network of an aircraft according to an embodiment of the invention.

The algorithm of FIG. 5 is described in an example in which the latter is executed by the processor 400.

The present algorithm is executed periodically, for example every 50 microseconds.

The processor 400 executes the present algorithm respectively for each inter-node link linking the node to another node.

In the step E40, the processor 400 acquires a measurement of the intensity of the current on the inter-node link linking the node to another node. For that, the processor 400 acquires a current intensity value supplied by that of the current intensity measurement means Sens1 to Sens3 corresponding to this inter-node link.

In the step E41, the processor 400 compares the current intensity measurement with a predetermined current intensity threshold (for example 15 A as indicated previously), so as to detect any overcurrent. If the current intensity measurement is greater than the predetermined current intensity threshold, the processor detects an overcurrent and goes on to the step E42. Otherwise, it does not detect any overcurrent and stops the execution of the algorithm: this algorithm returns to the step E40 upon its next execution.

In the step E42, the processor 400 commands the current limiter corresponding to the inter-node link considered, so as to limit the intensity of the current in this inter-node link to a predetermined current intensity value (for example 15 A as indicated previously). The voltage drop at the terminals of the current limiter, which was low (for example less than 10 Vdc) as long as the current limiter was not commanded to limit the current in the inter-node link, increases because the current limiter limits the intensity of the current in the inter-node link. In the particular case in which the current limiter is an electronic device comprising at least one transistor, this transistor operates in linear mode when it is commanded to limit the current.

In the step E50, the processor 400 acquires a measurement of the voltage on the inter-node link and stores the measured voltage value. More specifically, the processor 400 acquires a measurement of the voltage drop at the terminals of the current limiter of the inter-node link, supplied by that of the voltage measurement means V1 to V3 corresponding to this inter-node link.

In the step E52, the processor 400 reads, in the table stored in the non-volatile memory 402, a time associated with the value of the measured voltage drop.

In the step E53, the processor 400 activates a time delay whose time is equal to the time obtained in the step E52.

In the step E54, the processor 400 checks whether the time delay activated in the step E53 has elapsed.

In the affirmative, the processor 400 goes on to the step E55.

In the step E55, the processor 400 commands a measurement of the voltage on the inter-node link, in the same way as that described with reference to the step E50.

In the next step E56, the processor 400 checks whether a voltage drop is still present. For that, the processor 400 compares the voltage value measured in the step E55 to the voltage value measured in the step E50.

In the negative, the processor 400 stops the present algorithm.

In the affirmative, the processor 400 goes on to the step E57 and commands the opening of the switch allowing or preventing the passage of an electrical current in the inter-node link. In effect, as indicated previously, the presence of the voltage drop at the end of the time delay corresponds to a short-circuit on the inter-node link considered. The opening of the switch then makes it possible to isolate this inter-node link from the rest of the meshed network.

Obviously, the present invention is in no way limited to the embodiments described here, but encompasses, quite to the contrary, any variant within the grasp of a person skilled in the art.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A system for managing short-circuits in a meshed electrical energy distribution network of an aircraft, the electrical energy distribution network comprising nodes to which at least one power source and equipment items to be powered is connected by means of external links, the nodes being connected to one another by inter-node links forming at least one mesh of the meshed network, each mesh being polygonal of an order greater than or equal to three, wherein at least one node of the system comprises:
for at least one inter-node link linking the node to another node:
a switch,
a current limiter,
means for measuring an intensity of a current circulating on said inter-node link,
means for measuring a voltage drop on said inter-node link,
a control unit configured to:
acquire a current measurement on said at least one inter-node link, by the intensity measurement means,
compare the current measurement with a predetermined current threshold and, if the current measurement exceeds this predetermined threshold:
command the current limiter to limit the current on the inter-node link,
acquire a measurement of a voltage drop on the inter-node link by the voltage measurement means,
determine a time associated with a value of the voltage drop out of a plurality of times associated with different voltage drop values, each time being different from the other times and being less than each time associated with a voltage drop value less than the voltage drop value with which it is associated,
check whether the voltage drop is still present after a time period equal to the time obtained, and
if the voltage drop is still present after the time period equal to the time obtained, command an opening of the switch corresponding to this inter-node link so as not to allow a passage of an electrical current in this inter-node link on which the voltage drop has occurred.

2. The system according to claim 1, wherein the control unit is configured to keep the switch closed so as to allow the passage of an electrical current in the inter-node link on which the voltage drop has occurred, if the voltage drop is no longer present after the time period equal to the time obtained.

3. The system according to claim 1, wherein the node comprises a switch, a current limiter, means for measuring the intensity of a current and means for measuring a voltage drop for each inter-node link linking the node to another node.

4. The system according to claim 1, wherein each node of the meshed electrical energy distribution network of the aircraft is identical to the other nodes of the meshed electrical energy distribution network of the aircraft.

5. The system according to claim 1, wherein the current limiter is an electronic device.

6. The system according to claim 5, wherein the electronic device also provides the switch function for the inter-node link concerned.

7. The system according to claim 1, wherein the voltage measurement means are conformed to measure a voltage at terminals of the current limiter.

8. An aircraft comprising a system for managing short-circuits in a meshed electrical energy distribution network of the aircraft according to claim 1.

9. A node of a meshed electrical energy distribution network of an aircraft, the electrical energy distribution network comprising nodes to which at least one power source and equipment items to be powered is connected by means of links, called external links, the nodes being connected to one another by inter-node links forming at least one mesh of the meshed network, each mesh being polygonal of an order greater than or equal to three, said node comprising:
for at least one inter-node link linking the node to another node:
a switch,
a current limiter,
means for measuring an intensity of a current circulating on said inter-node link,
means for measuring a voltage drop on said inter-node link,
a control unit configured to:
acquire a current measurement on said at least one inter-node link, by the intensity measurement means,
compare the current measurement with a predetermined current threshold and, if the current measurement exceeds this predetermined threshold:
command the current limiter to limit the current on the inter-node link, acquire a measurement of a voltage drop on the inter-node link by the voltage measurement means, determine a time associated with a value of the voltage drop out of a plurality of times associated with different voltage drop values, each time being different from the other times and being less than each time associated with a voltage drop value less than the voltage drop value with which it is associated, check whether the voltage drop is still present after a time period equal to the time obtained, and if the voltage drop is still present after the time period equal to the time obtained, command an opening of the switch corresponding to this inter-node link so as not to allow a passage of an electrical current in this inter-node link on which the voltage drop has occurred.

10. A method for managing short-circuits in a meshed electrical energy distribution network of an aircraft, the electrical energy distribution network comprising nodes to which at least one power source and equipment items to be powered is connected by means of links, called external links, the nodes being connected to one another by inter-node links forming at least one mesh of the meshed network, each mesh being polygonal of an order greater than or equal to three, wherein, at least one node comprises:

for at least one inter-node link linking the node to another node:
  a switch,
  a current limiter,
  means for measuring an intensity of a current circulating on said inter-node link,
  means for measuring a voltage drop on said inter-node link,
a control unit, the method comprises the following steps executed by the control unit:

acquiring a current measurement on said at least one inter-node link, by the intensity measurement means, comparing the current measurement with a predetermined current threshold and, if the current measurement exceeds this predetermined threshold:
  commanding the current limiter to limit the current on the inter-node link,
  acquiring a measurement of a voltage drop on the inter-node link by the voltage measurement means,
  determining a time associated with a value of the voltage drop out of a plurality of times associated with different voltage drop values, each time being different from the other times and being less than each time associated with a voltage drop value less than the voltage drop value with which it is associated,
  checking whether the voltage drop is still present after a time period equal to the time obtained, and
  if the voltage drop is still present after the time period equal to the time obtained, commanding an opening of the switch corresponding to this inter-node link so as not to allow a passage of an electrical current in this inter-node link on which the voltage drop has occurred.

* * * * *